(12) United States Patent  
van Haaster (10) Patent No.: US 7,763,810 B2  
(45) Date of Patent: Jul. 27, 2010

(54) FABRIC-OVER-FOAM EMI GASKETS HAVING TRANSVERSE SLITS AND RELATED METHODS

(75) Inventor: Philip van Haaster, Corona, CA (US)

(73) Assignee: Laird Technologies, Inc., Chesterfield, MO (US)

( * ) Notice: Subject to any disclaimer, the term of this patent is extended or adjusted under 35 U.S.C. 154(b) by 0 days.

(21) Appl. No.: 12/025,231

(22) Filed: Feb. 4, 2008

(65) Prior Publication Data

US 2009/0114438 A1    May 7, 2009

Related U.S. Application Data

(60) Provisional application No. 60/986,193, filed on Nov. 7, 2007.

(51) Int. Cl.  
*H05K 9/00* (2006.01)

(52) U.S. Cl. .................. 174/357; 174/369; 277/920

(58) Field of Classification Search ............ 174/354, 174/356, 357, 366, 369; 361/816, 818; 277/920  
See application file for complete search history.

(56) References Cited

U.S. PATENT DOCUMENTS 5,202,536 A    4/1993    Buonanno  
5,511,798 A *  4/1996    Kawamoto et al. .......... 277/647  
5,656,795 A *  8/1997    Miska .......................... 174/356  
6,483,023 B1  11/2002    Jacques et al.  
6,534,706 B1   3/2003    Rapp et al.  
6,774,301 B1   8/2004    Kordes et al.  
6,943,288 B1 * 9/2005    Miska .......................... 174/388  
7,078,614 B1   7/2006    van Haaster  
7,084,344 B1   8/2006    Gilliland et al.  
7,112,740 B2   9/2006    van Haaster  
2003/0051891 A1  3/2003  Rapp et al.  
2006/0272855 A1* 12/2006 Rutherford et al. .......... 174/350

FOREIGN PATENT DOCUMENTS

| EP | 0967019 | 12/1999 |
| EP | 1052887 | 11/2000 |
| EP | 1158846 | 11/2001 |
| EP | 1701605 | 9/2006 |
| WO | WO 99/22555 A1 | 5/1999 |
| WO | WO01/54467 | 7/2001 |
| WO | WO 2005/122665 A2 | 12/2005 |

* cited by examiner

*Primary Examiner*—Hung V Ngo  
(74) *Attorney, Agent, or Firm*—Harness, Dickey & Pierce, P.L.C.

(57) ABSTRACT

According to various aspects, exemplary embodiments are provided of fabric-over-foam EMI gaskets. In one exemplary embodiment, a fabric-over-foam EMI gasket generally includes a resiliently compressible foam core and an outer electrically-conductive fabric layer. At least one slit extends generally transversely across an upper surface portion of a longitudinally extending region of the gasket.

25 Claims, 11 Drawing Sheets

Table 1: Resistance and Load Measurements for Bell Shaped Fabric Over Foam (FOF) Gaskets

| # Cycles | | 0 | | 100 | | 500 | | 1000 | | 5000 | |
|---|---|---|---|---|---|---|---|---|---|---|---|
| Sample | | Resistance (mOhm) | Load (lbf) | Resistance (mOhm) | Load (lbf) | Resistance (mOhm) | Load (lbf) | Resistance (mOhm) | Load (lbf) | Resistance (mOhm) | Load (lbf) |
| Standard | Average | 5.11 | 2.98 | 7.29 | 3.19 | 8.75 | 3.11 | 12.21 | 1.89 | 13.02 | 1.75 |
| Standard | Std. Dev. | 0.67 | 0.69 | 2.34 | 0.52 | 4.27 | 0.56 | 3.72 | 0.60 | 3.34 | 0.49 |
| Slotted | Average | 7.44 | 1.46 | 9.56 | 1.54 | 16.20 | 1.26 | 15.61 | 1.35 | 20.89 | 1.09 |
| Slotted | Std. Dev. | 1.25 | 0.07 | 2.21 | 0.28 | 11.46 | 0.14 | 9.54 | 0.23 | 10.47 | 0.13 |

Values are the average and standard deviation of 12 measurements taken from 3 different gaskets (standardized to one inch).

FABRIC-OVER-FOAM EMI GASKETS HAVING TRANSVERSE SLITS AND RELATED METHODS

CROSS-REFERENCE TO RELATED APPLICATION

This application claims the benefit of U.S. Provisional Application No. 60/986,193 filed Nov. 7, 2007. The disclosure of this provisional application is incorporated herein by reference.

FIELD

The present disclosure generally relates to fabric-over-foam EMI gaskets.

BACKGROUND

The statements in this section merely provide background information related to the present disclosure and may not constitute prior art.

During normal operation, electronic equipment can generate undesirable electromagnetic energy that can interfere with the operation of proximately located electronic equipment due to electromagnetic interference (EMI) transmission by radiation and conduction. The electromagnetic energy can be of a wide range of wavelengths and frequencies. To reduce the problems associated with EMI, sources of undesirable electromagnetic energy may be shielded and electrically grounded. Shielding can be designed to prevent both ingress and egress of electromagnetic energy relative to a housing or other enclosure in which the electronic equipment is disposed. Since such enclosures often include gaps or seams between adjacent access panels and around doors and connectors, effective shielding can be difficult to attain because the gaps in the enclosure permit transference of EMI therethrough. Further, in the case of electrically conductive metal enclosures, these gaps can inhibit the beneficial Faraday Cage Effect by forming discontinuities in the conductivity of the enclosure which compromise the efficiency of the ground conduction path through the enclosure. Moreover, by presenting an electrical conductivity level at the gaps that is significantly different from that of the enclosure generally, the gaps can act as slot antennae, resulting in the enclosure itself becoming a secondary source of EMI.

EMI gaskets have been developed for use in gaps and around doors to provide a degree of EMI shielding while permitting operation of enclosure doors and access panels and fitting of connectors. To shield EMI effectively, the gasket should be capable of absorbing or reflecting EMI as well as establishing a continuous electrically conductive path across the gap in which the gasket is disposed. These gaskets can also be used for maintaining electrical continuity across a structure and for excluding from the interior of the device such contaminates as moisture and dust. Once installed, the gaskets essentially close or seal any interface gaps and establish a continuous electrically-conductive path thereacross by conforming under an applied pressure to irregularities between the surfaces. Accordingly, gaskets intended for EMI shielding applications are specified to be of a construction that not only provides electrical surface conductivity even while under compression, but which also has a resiliency allowing the gaskets to conform to the size of the gap.

As used herein, the term "EMI" should be considered to generally include and refer to EMI emissions and RFI emissions, and the term "electromagnetic" should be considered to generally include and refer to electromagnetic and radio frequency from external sources and internal sources. Accordingly, the term shielding (as used herein) generally includes and refers to EMI shielding and RFI shielding, for example, to prevent (or at least reduce) ingress and egress of EMI and RFI relative to a housing or other enclosure in which electronic equipment is disposed.

SUMMARY

According to various aspects, exemplary embodiments are provided of fabric-over-foam EMI gaskets. In one exemplary embodiment, a fabric-over-foam EMI gasket generally includes a resiliently compressible foam core and an outer electrically-conductive fabric layer. At least one slit extends generally transversely across an upper surface portion of a longitudinally extending region of the gasket.

In another exemplary embodiment, a fabric-over-foam EMI gasket generally includes a resiliently compressible foam core and an outer electrically-conductive fabric layer. The gasket also includes an array of slits that generally linearly extend transversely across an upper surface portion of a generally longitudinally extending region of the gasket. A plurality of contact elements are defined generally between corresponding pairs of adjacent slits.

Additional aspects provide methods relating to fabric-over-foam EMI gaskets, such as methods of using and/or making fabric-over-foam EMI gaskets. One exemplary embodiment provides a method of making a fabric-over-foam EMI gasket for interposition between first and second surfaces, where the gasket includes a resiliently compressible foam core and an outer electrically-conductive fabric layer. In this embodiment, the method generally includes forming at least one slit that extends generally transversely across an upper surface portion of a generally longitudinally extending region of the gasket.

Another exemplary embodiment relates to a method of provided electromagnetic interference shielding for a gap between first and second surfaces with a fabric-over-foam EMI gasket, wherein the gasket includes a resiliently compressible foam core, an outer electrically-conductive fabric layer, and at least one slit extending generally transversely across an upper surface portion of a generally longitudinally extending region of the gasket. In this embodiment, the method generally includes installing the gasket generally between the first and second surfaces such that the gasket is compressively sandwiched under pressure into a deflected, collapsed orientation between the first and second surfaces.

Further aspects and features of the present disclosure will become apparent from the detailed description provided hereinafter. In addition, any one or more aspects of the present disclosure may be implemented individually or in any combination with any one or more of the other aspects of the present disclosure. It should be understood that the detailed description and specific examples, while indicating exemplary embodiments of the present disclosure, are intended for purposes of illustration only and are not intended to limit the scope of the present disclosure.

DRAWINGS

The drawings described herein are for illustration purposes only and are not intended to limit the scope of the present disclosure in any way.

DETAILED DESCRIPTION

The following description is merely exemplary in nature and is in no way intended to limit the present disclosure, application, or uses.

Figure 1:
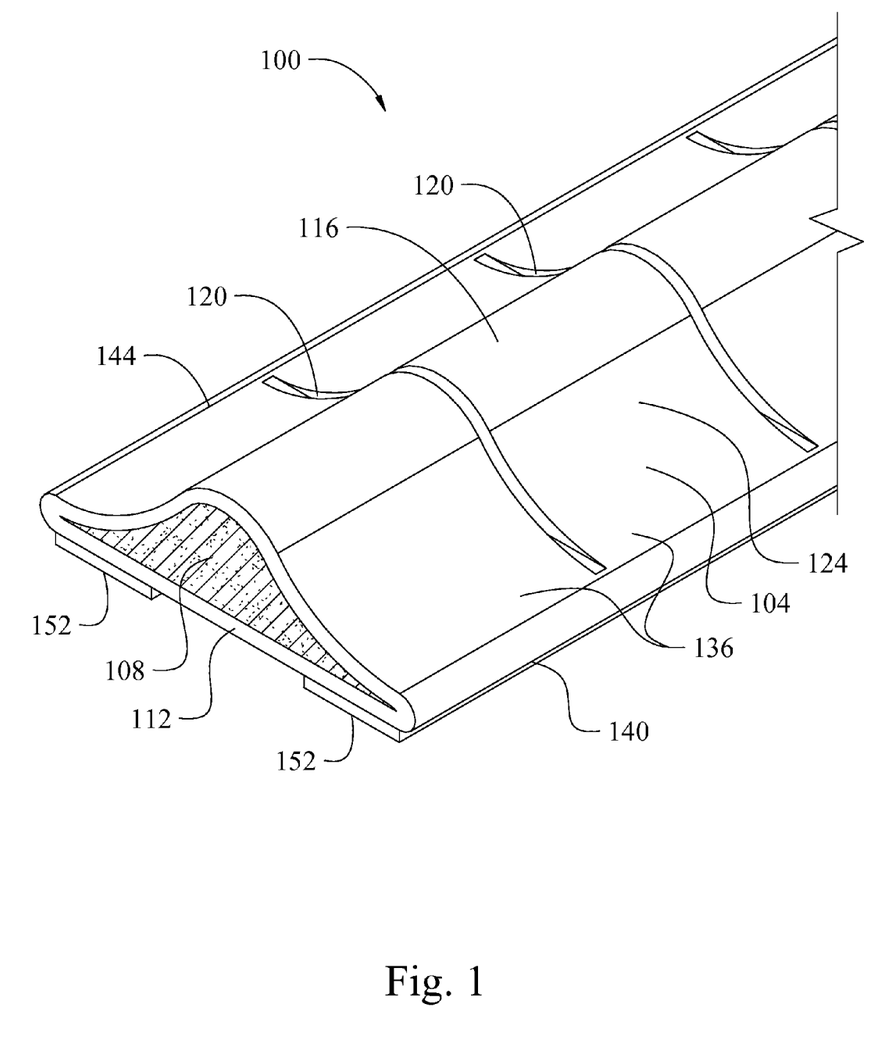
FIG. 1 is an upper perspective view of an exemplary fabric-over-foam EMI gasket having slits according to exemplary embodiments.
Figure 2:
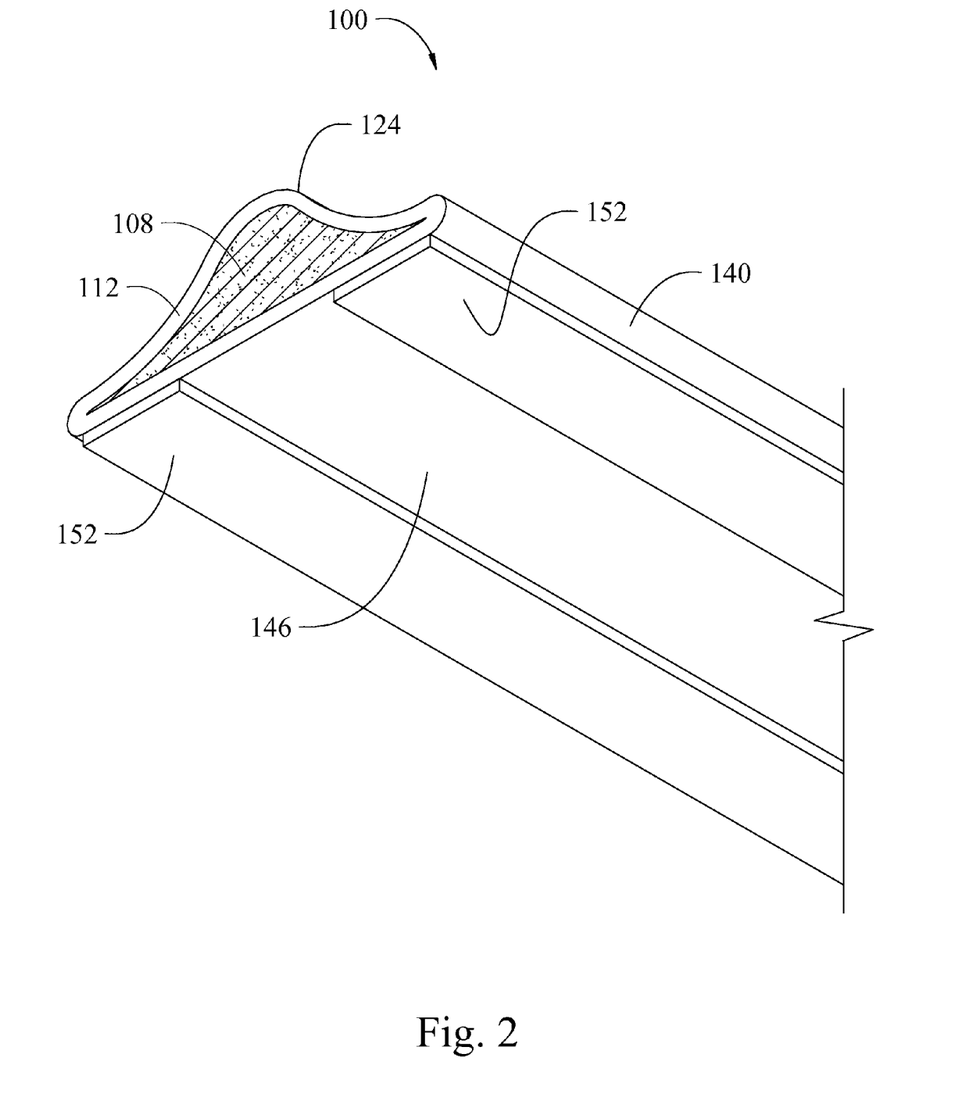
FIG. 2 is a lower perspective view of the fabric-over-foam EMI gasket shown in FIG. 1, and illustrating exemplary adhesive strips that may be used for attaching the gasket to a mounting surface according to exemplary embodiments.
Figure 3:
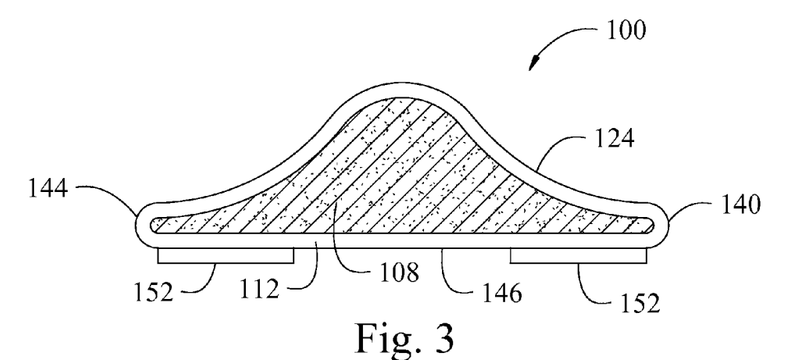
FIG. 3 is an end elevation view of the fabric-over-foam EMI gasket shown in FIG. 1, and illustrating the gasket's generally bell-shaped profile according to exemplary embodiments.
Figure 4:
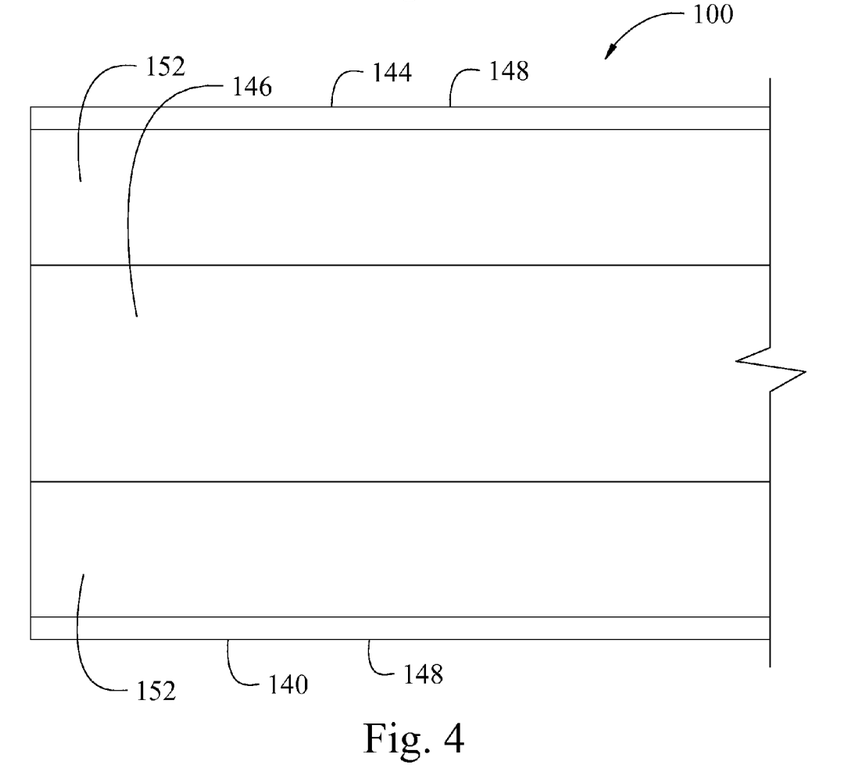
FIG. 4 is a bottom plan view of the fabric-over-foam EMI gasket shown in FIG. 1.

FIGS. 1 through 3 illustrate an exemplary EMI fabric-over-foam gasket 100 embodying one or more aspects of the present disclosure. As shown in FIG. 1, the gasket 100 includes a body 104 of indefinite length (as the gasket body 104 may be provided in various lengths depending, for example, upon the particular installation or end-use intended for the gasket 100). The gasket 100 includes a resiliently compressible foam core 108 and an outer electrically-conductive fabric layer or portion 112 disposed generally around or about an outer side surface of the resiliently compressible foam 108. As shown in FIG. 3, the electrically-conductive outer layer 112 is not wrapped over and does not cover the ends of the gasket 100, such that the resiliently compressible foam core 108 is exposed at the ends of the gasket 100. Alternatively, other embodiments may include fabric or other material disposed over the ends of the gasket for covering the foam.

Figure 5:
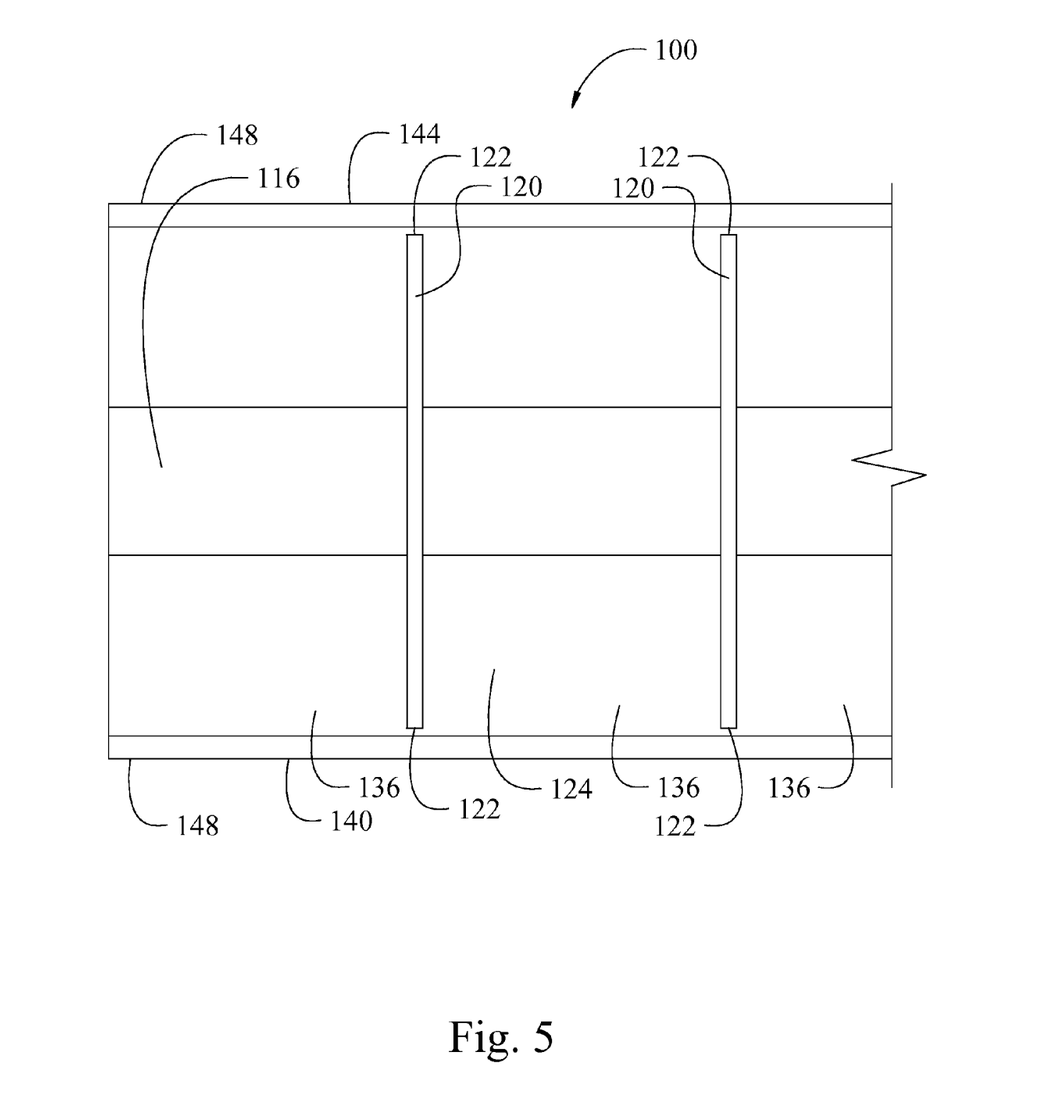
FIG. 5 is a top plan view of the fabric-over-foam EMI gasket shown in FIG. 1.
Figure 6:
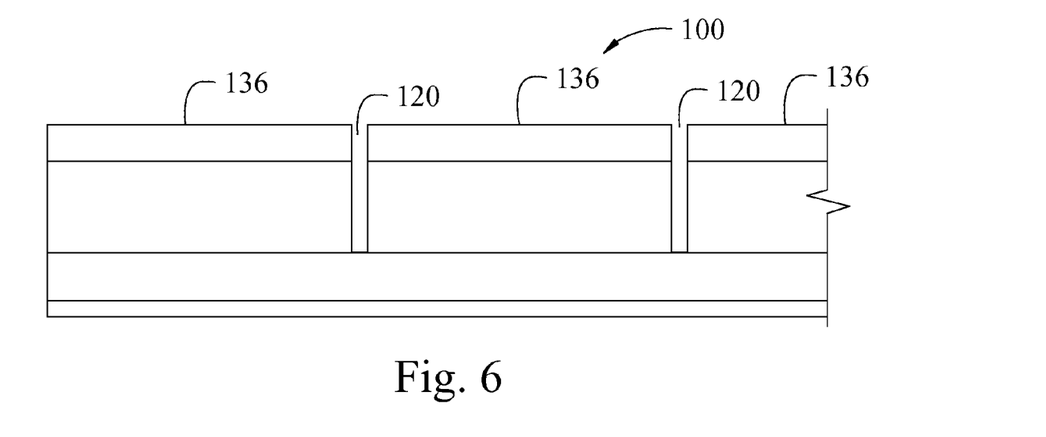
FIG. 6 is a side elevation view of the fabric-over-foam EMI gasket shown in FIG. 1.
Figure 8:
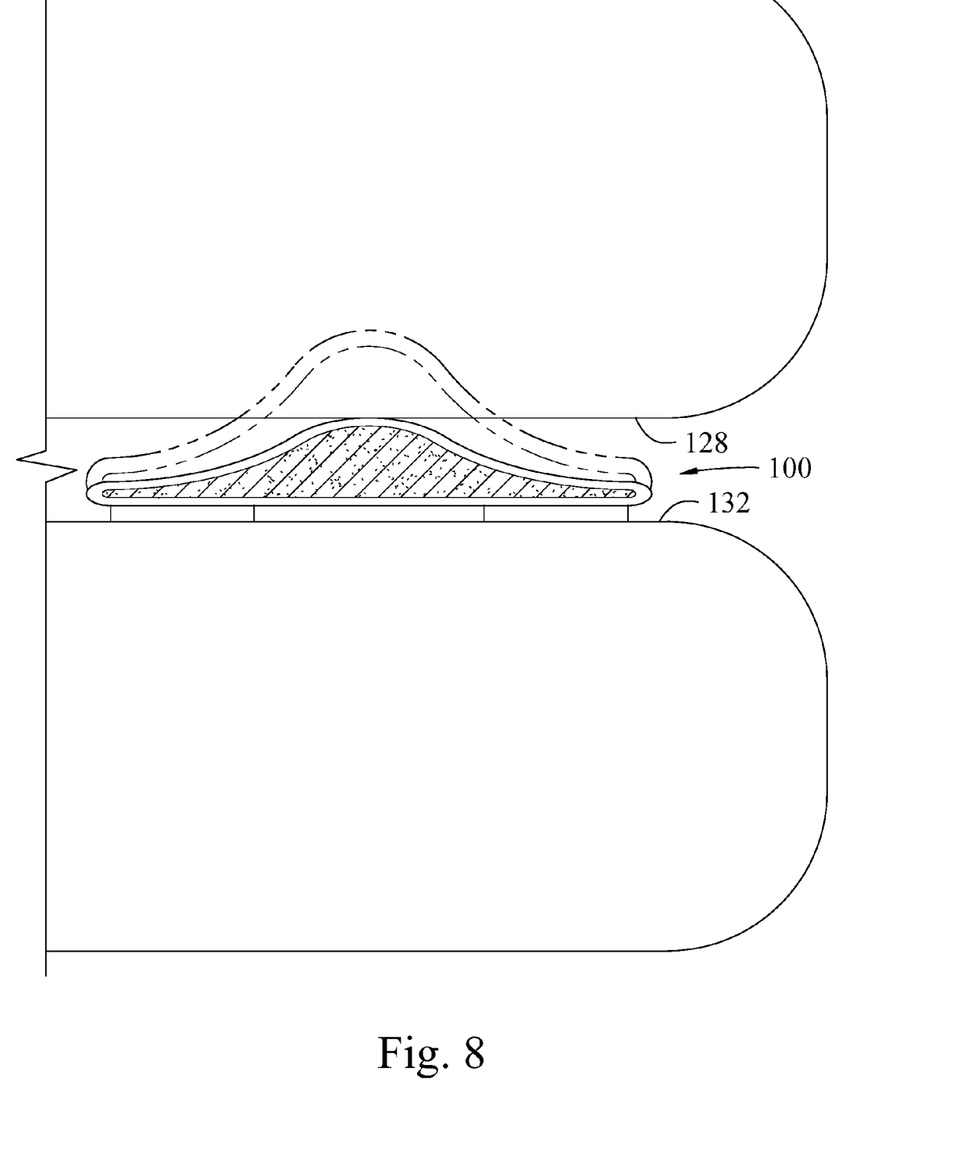
FIG. 8 is an end elevation view of the fabric-over-foam EMI gasket shown in FIG. 7 compressed generally between the upper surface and the lower mounting surface according to exemplary embodiments.
Figure 15:
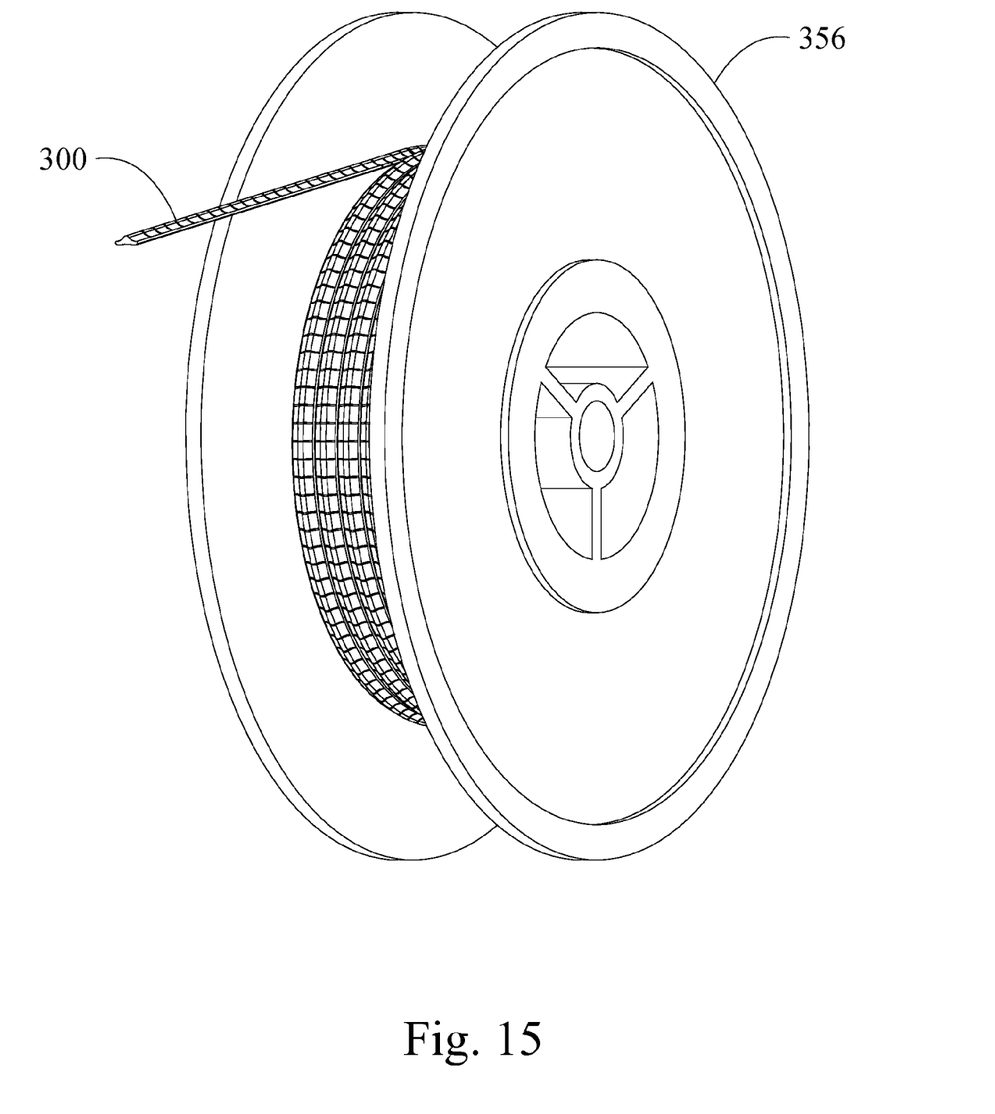
FIG. 15 is a perspective view of a reel on which a fabric-over-foam gasket having slits has been reeled onto according to exemplary embodiments.

As shown in FIGS. 1 and 5, the gasket 100 includes a generally longitudinally extending region 116 and an array of slits or slots 120. Each slit 120 extends generally transversely across an upper surface portion 124 of the generally longitudinally extending region 116. In some embodiments, the slits 120 may be configured for helping reduce (or eliminate in some embodiments) strain along a longitudinal axis of the gasket 100 when the gasket 100 is compressively sandwiched under pressure into a deflected, collapsed orientation between first and second surfaces 128, 132 (e.g., a deflected, collapsed orientation is shown in FIG. 8). Additionally, the slits 120 may also be configured so as to impart or provide the gasket 100 with sufficient flexibility to be reeled, wound, or spooled onto a reel or spool. In such embodiments, the gasket 100 may be stored and/or shipped while it is on the reel or spool. For example, FIG. 15 illustrate a gasket 300 having slits that has been reeled, wound, or spooled onto a reel or spool 356.

With continued reference to FIG. 5, the illustrated slits 120 are generally rectangular in shape when viewed from above and are substantially identical in configuration (e.g., equally sized, same shapes, etc.). In addition, the slits 120 are about evenly or equally spaced apart. In some exemplary embodiments, the slits 120 are evenly spaced along the gasket length at 0.200 inch or 0.210 inch intervals. Alternative embodiments may include slits spaced at smaller or larger intervals along the gasket length, and/or slits that are not evenly spaced apart. In addition, other embodiments of a gasket may include more or less slits and/or slits in other configurations (e.g., different shapes, different sizes, larger or smaller intervals, other locations, etc.) than what is shown in FIG. 5.

Figure 10:
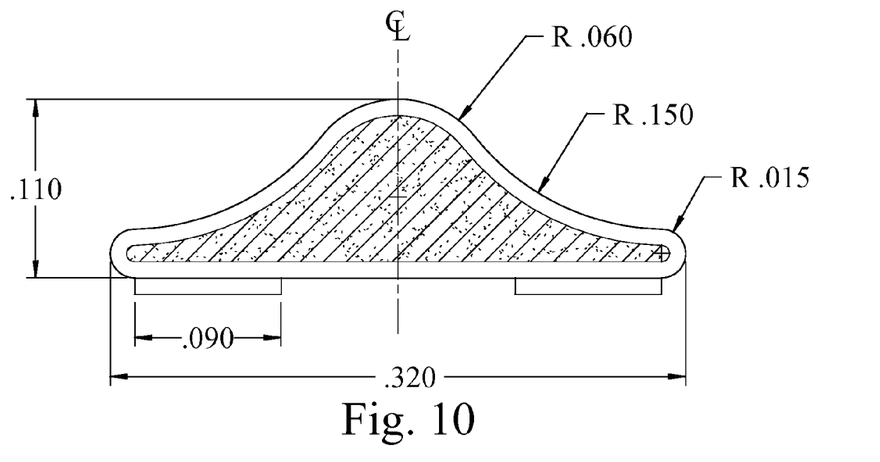
FIG. 10 is an end elevation view of the fabric-over-foam EMI gasket shown in FIG. 1 with exemplary dimensions (in inches) provided for purposes of illustration only according to an exemplary embodiment.
Figure 11:
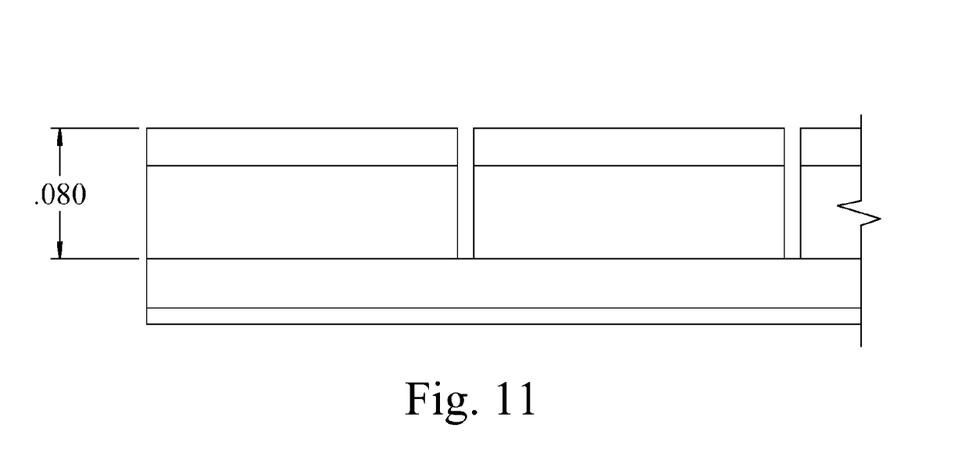
FIG. 11 is a side elevation view of the fabric-over-foam EMI gasket shown in FIG. 1 with exemplary dimensions (in inches) provided for purposes of illustration only according to an exemplary embodiment.

In some embodiments, the slits 120 are formed (e.g., cut without removing material, rotary die cutter, notched such that material is removed, etc.) such that the slits 120 extend completely through the fabric 112 but only partially through the resiliently compressible foam core 108. In some embodiments, the slits 120 extend almost completely through (e.g., seventy percent or more, etc.) the gasket 100 to allow for relatively independent movement of the various sections or contact elements 136 of the gasket 100 defined by or separated by the slits 120. For example, FIGS. 10 and 11 illustrate an exemplary embodiment in which the slits penetrate and extend 0.80 inches downwardly into the gasket's overall height of 0.110 inches. In other embodiments, the slits 120 may penetrate completely through the gasket 100, and the slits 120 may have closed ends 122 forming a solid margin 148 along each side of the gasket 100 that holds the various gasket sections 136 together. By adding slits 120 to the gasket 100, sections 136 of the gasket 100 may thus function (e.g., flex, move, compress, deform, etc.) relatively independently from each other. With this independent movement enabled by the slits 120, the axial strain load along the longitudinal axis of the gasket 100 may be reduced (or eliminated in some embodiments). Without such slits 120, the axial strain load might otherwise affect the deflection loads along the gasket 100.

By way of example, the slits 120 may be formed by a cutting process without removing material. In one exemplary method, the slits 120 are formed by feeding the fabric-over-foam gasket construction through a rotary die cutter. Alternative processes may also be used to make a gasket having one or more slits, depending, for example, on the penetration depth of the slits into the gasket (e.g., greater or lesser extent than seventy percent, etc.). By way of example, some embodiments may include forming the slits such that material is removed, such as by notching out the slits (e.g., 0.020 inch wide slits, etc.).

With continued reference to FIGS. 1 and 5, the slits 120 provide the gasket 100 with and define resiliently flexible sections or contact elements 136. Other than the contact elements 136 at the ends of the gasket 100, the remaining contact elements 136 are disposed between corresponding pairs of adjacent slits 120. Also, each slit 120 is disposed between corresponding pairs of adjacent contact elements 136. The slits 120 allow the contact elements 136 to flex, compress, deform, and/or move inwardly and outwardly relatively independently from one another.

As shown in FIG. 5, the slits 120 linearly extend generally between gasket's first and second side edge portions 140, 144, which, in turn, extend generally longitudinally along the length of the body 104. The slits 120 linearly extend generally perpendicular to the first and second side edge portion 140, 144.

The slits 120 do not extend entirely across the gasket 100. Instead, this particular embodiment includes slits 120 that are sized such that each slit 120 extends transversely across about ninety percent of the total width of the gasket (as measured in the transverse direction defined from the first side edge portion 140 to the second side edge portion 144). Alternative embodiments may include slits 120 that extend transversely across the gasket to a greater or lesser extent than ninety percent of the total gasket width.

As shown in FIG. 3, the gasket 100 has a generally bell-shaped profile cooperatively defined by the gasket's generally flat lower surface 146, curved side edge portions 140, 144, and curved upper surface portion 124. Alternative embodiments may include gaskets having other suitable cross-sections or profiles, such as D-shaped profiles, generally triangular-shaped profiles, etc. Other embodiments may include gaskets having profiles and/or fabric-over-foam constructions as disclosed in any one of U.S. Design patent application Ser. No. 29/295,585 filed Oct. 2, 2007, U.S. Design patent application Ser. No. 29/295,590 filed Oct. 2, 2007, U.S. Design patent application Ser. No. 29/295,605 filed Oct. 2, 2007, and U.S. Design patent application Ser. No. 29/299,924 filed Jan. 7, 2008. The disclosures of these design patent applications are incorporated herein by reference.

In addition, the side edge portions 140, 144 are configured with generally concave curvatures relative to the resiliently compressible foam core 108. The first and second side edge portions 140, 144 connect the gasket's lower surface 148 to the gasket's upper surface portion 124. As shown in FIGS. 1 and 5, each end portion 122 of the slits 120 is closed and thus not open-ended. The slits 120 also extend along the upper surface portion 124 without extending into the first and second curved side edge portions 140, 144. Accordingly, the gasket 100 includes a solid margin 148 along each longitudinal side edge portion 140, 144 of the gasket 100. The solid margins 148 provide a continuous length of material along the entire length of the side edge portions 140, 144 of gasket 100. The solid margins 148 may help provide added rigidity to the gasket 100. The sold margins 148 may also help hold the various gasket sections 136 together in those exemplary embodiments in which the slits 120 penetrate completely through the gasket 100.

Figure 7:
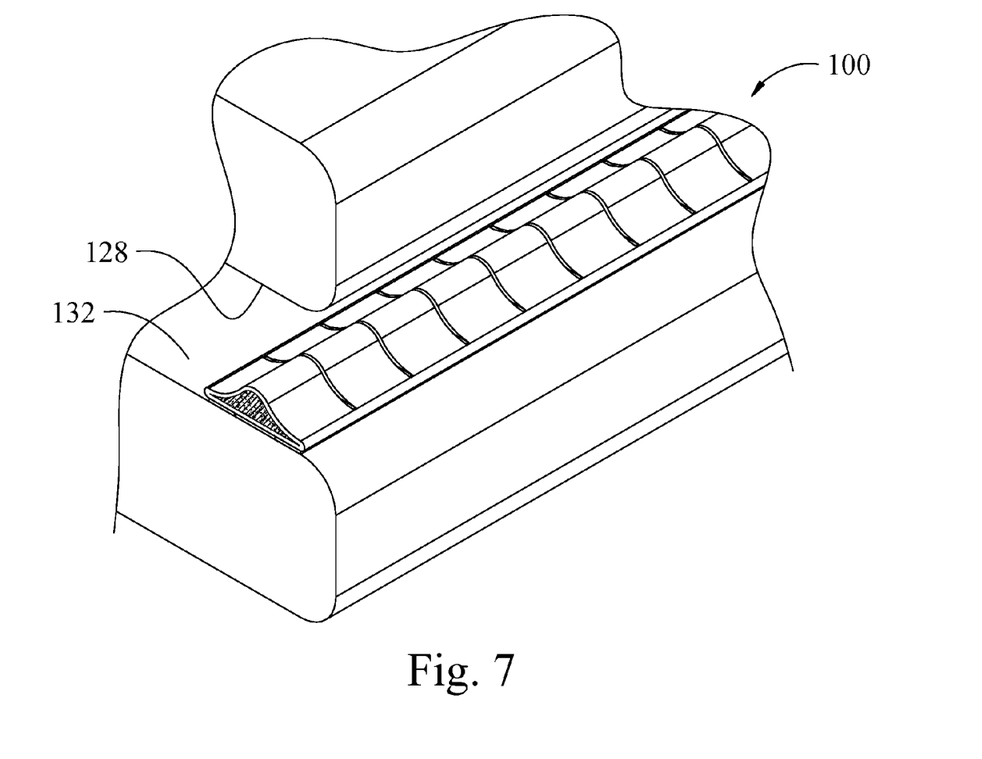
FIG. 7 is an upper perspective view of the fabric-over-foam EMI gasket shown in FIG. 1 attached to a mounting surface according to exemplary embodiments.

FIGS. 7 and 8 generally illustrate the ability of the gasket 100 to be compressively sandwiched under pressure into a deflected, collapsed orientation between first and second surfaces 128, 132. In FIGS. 7 and 8, the gasket 100 has been mounted to the second surface 132 via electrically-conductive adhesive strips 152. Alternative embodiments may include different mounting means or devices besides electrically-conductive adhesive strips 152. In addition, other embodiments may mount a gasket at different locations than what is show in FIGS. 7 and 8.

With further reference to FIG. 7, the gasket 100 has not yet been positioned with the gap between the first and second surfaces 128, 132. But in FIG. 8, the gasket 100 is shown positioned with the gap between the surfaces 128, 132 with the upper surface 128 abutting against the upper surface of the gasket 100, such that the gasket 100 is deflected, deformed, or compressed into a deflected, collapsed orientation. The compression of the gasket 100 provides the gasket 100 with a reduced height, thereby allowing the gasket 100 to fit into a gap or reduced application area. In some embodiments, the compression of the gasket 100 between the two surfaces 128, 132 may also help the gasket 100 have better electrical conductivity with the surfaces 128, 132 for EMI shielding performance.

In FIG. 8, the dashed line represents the upper portion of the gasket 100 when uncompressed as shown in FIG. 7. The surfaces 128, 132 may be defined by or be part of a wide range of components, such as sliding drawers. In one particular embodiment, the surfaces 128, 132 may be moved relative to one another so as to position the gasket 100 therebetween. That is, the first surface 128 may be moved towards the second surface 132 as the second surface 132 remains stationary, or the second surface 132 may be moved towards the first surface 128 as the first surface 128 remains stationary, or both surfaces 128, 132 may be moved towards each other.

A wide range of materials may be used for making any of the various gaskets (e.g., 100, etc.) disclosed herein. In some exemplary embodiments of a fabric-over-foam gasket, the resiliently compressible foam core 108 is formed of polyurethane foam, and an electrically-conductive outer fabric layer 112 is formed from nylon ripstock (NRS) fabric coated with nickel and/or copper. In addition, the fabric 112 may be bonded to the resiliently compressible foam core 108 by a pressure sensitive adhesive. Alternative embodiments may include other suitable materials for the resiliently compressible foam core (e.g., other porous substrates, other open-celled foam materials, etc.), outer electrically-conductive fabric layer (nickel-plated polyester or taffeta fabric, nickel/copper plated knit mesh, etc.) and/or other bonding means for attaching the fabric to the foam.

Figure 9:
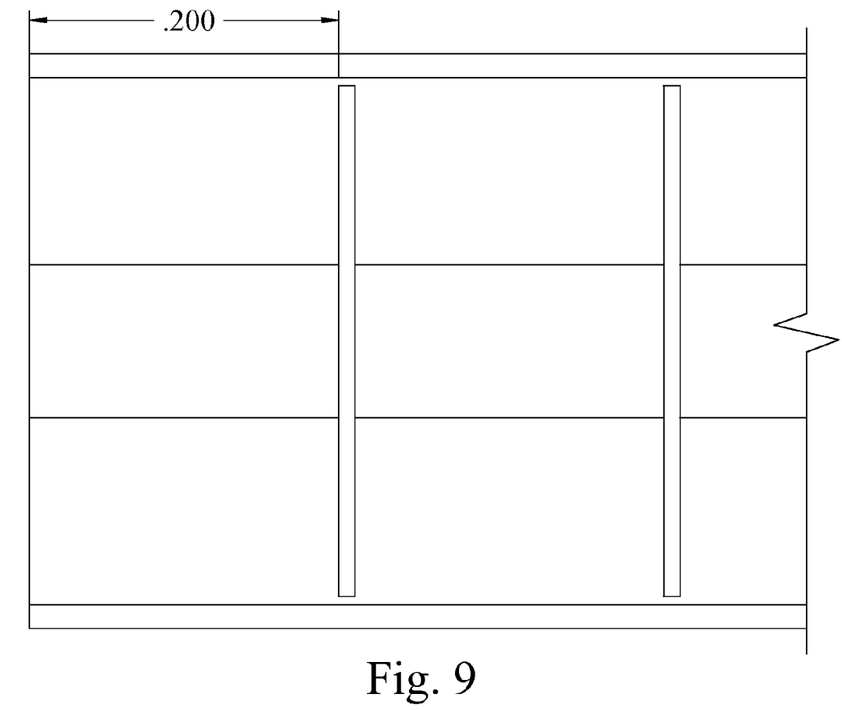
FIG. 9 is a top plan view of the fabric-over-foam EMI gasket shown in FIG. 1 with exemplary dimensions (in inches) provided for purposes of illustration only according to an exemplary embodiment.

FIGS. 9 through 11 illustrate exemplary dimensions in inches that may be used for the gasket 100 shown in FIGS. 1 through 6 or for other gaskets disclosed herein. For this particular illustrated example, the gasket may have a length of about 0.750 inches, a width of about 0.320 inches (FIG. 10), and a free-standing uncompressed height (excluding the height of the adhesive strips 152) of about 0.110 inches (FIG. 10). In addition, the slits may be spaced along the length of the gasket at intervals of about 0.200 inches (FIG. 9). In some embodiments, the width of the slits (as measured in the transverse direction defined from the first side edge portion to the second side edge portion) is about 0.290 inches, or stated differently, about ninety percent of the gasket's total width 0.320 inches (FIG. 10). In addition, as shown by FIGS. 10 and 11, the slits may penetrate about 0.80 inches into the gasket's overall height of 0.110 inches. These dimensions are disclosed solely for purposes of illustration only and not for purposes of limitation. The specific dimensions for a particular gasket may depend, for example, upon the material properties of the gasket, particular installation or end-use (e.g., height of the gap, etc.) intended for the gasket, desired shielding effectiveness, etc. In addition, the dimensions may vary as a function of location along the gasket such that the gasket may be thicker in one region than another to accommodate gaps of different thickness in the enclosure and connector locations. The dimensions of the gasket may be varied accordingly in order to achieve the desired contact and/or to tailor the gasket for a particular installation.

A description will now be provided of an exemplary method for making a fabric-over-foam gasket having slits (e.g., gasket 100 (FIGS. 1 through 6), etc.). This example is provided for purposes of illustration only, as other methods, materials, and/or configurations may also be used.

Figure 12:
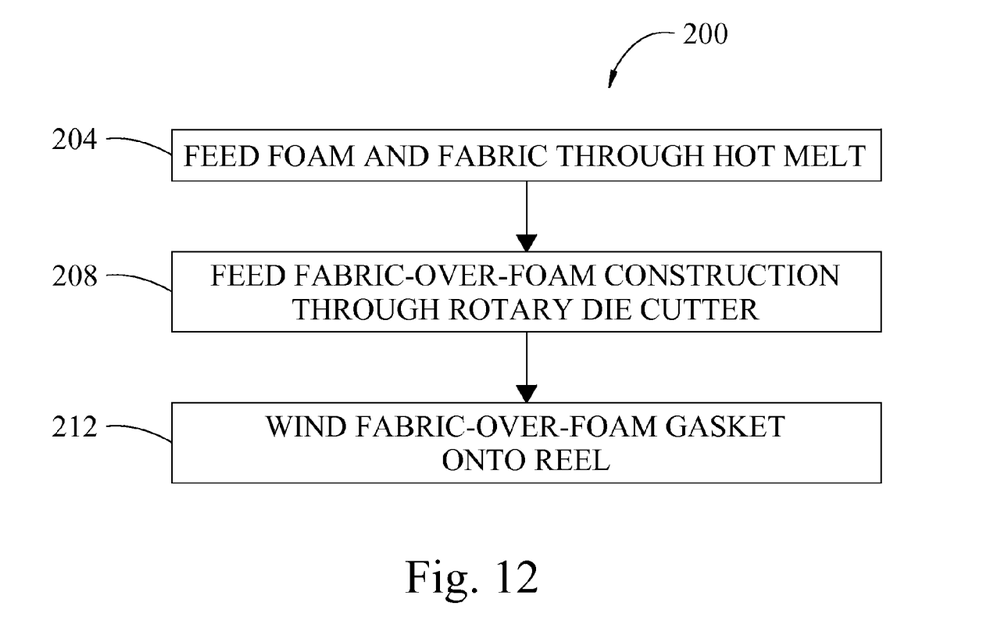
FIG. 12 is a process flow diagram of an exemplary method of making a fabric-over-foam gasket according to exemplary embodiments.

FIG. 12 illustrates an exemplary method 200 by which a fabric-over-foam gasket having slits may be formed. For this particular exemplary method 200, process 204 includes feeding resiliently compressible foam (e.g., polyurethane foam, etc.) and electrically-conductive fabric (e.g., nylon ripstock (NRS) fabric coated with nickel and/or copper, etc.) through a hot melt. With process 204, the fabric is bonded (e.g., hot melt adhesive, etc.) to the foam and the resulting fabric-over-foam construction is provided with the corresponding gasket profile or shape (e.g., generally bell-shaped profile (FIG. 3), generally D-shaped profile, generally rectangular profile, etc.). Alternative embodiments may include using other processes besides hot melt for bonding the fabric to the foam.

Process 208 includes feeding the fabric-over-foam construction from process 204 through a rotary die cutter. With process 208, slits are cut into the fabric and foam without removing foam or fabric material. The slits are formed so as to allow for relatively independent movement of the gasket sections or contact elements defined by the slits. Except for the sections at the ends of the gasket, each gasket section or contact element is defined generally between a corresponding pair of slits. In some embodiments, the slits are cut into the fabric and foam such that they penetrate and extend completely through the fabric but only partially through the foam. In other embodiments, the slits are cut into the fabric and foam such that they penetrate and extend completely through the fabric and the foam. In addition, some embodiments may include forming the slits into the fabric and foam such that material is removed. By way of example, one embodiment may include notching out a slit or slot (e.g., 0.020 inch wide slot, etc.).

Process 212 may include winding, reeling, or spooling the fabric-over-foam gasket having the slits onto a reel or spool. The gasket may be stored and/or shipped while it is on the reel or spool. By way of example, FIG. 15 illustrate a gasket 300 having slits that has been reeled, wound, or spooled onto a reel or spool 356.

Figure 13:
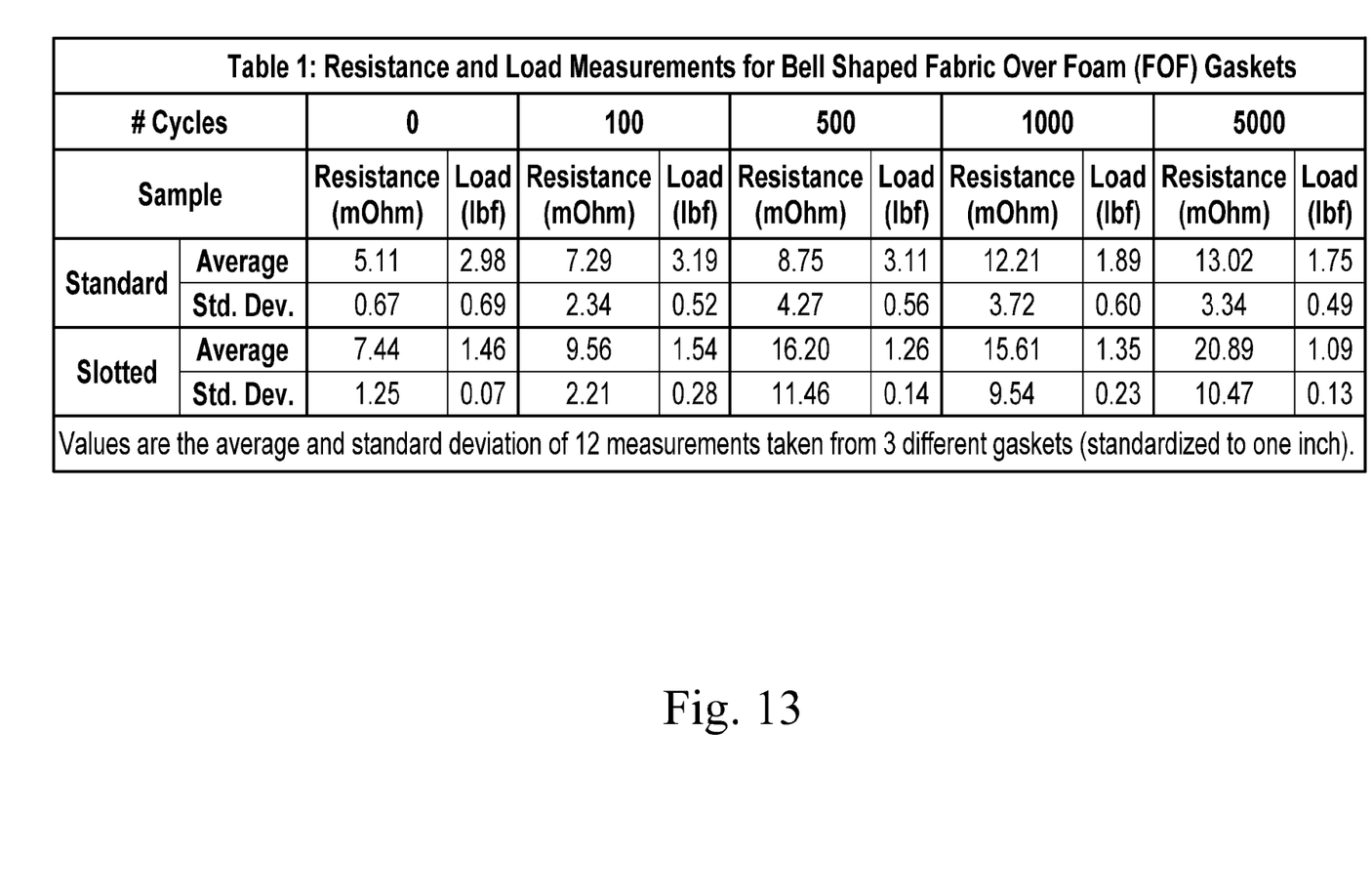
FIG. 13 is a table setting forth exemplary cycle testing data pertaining to resistance (in Milliohms) and load (in pound-force) for two different fabric-over-foam gasket configurations each having generally bell-shaped profiles but only one of which included slits according to exemplary embodiments.
Figure 14:
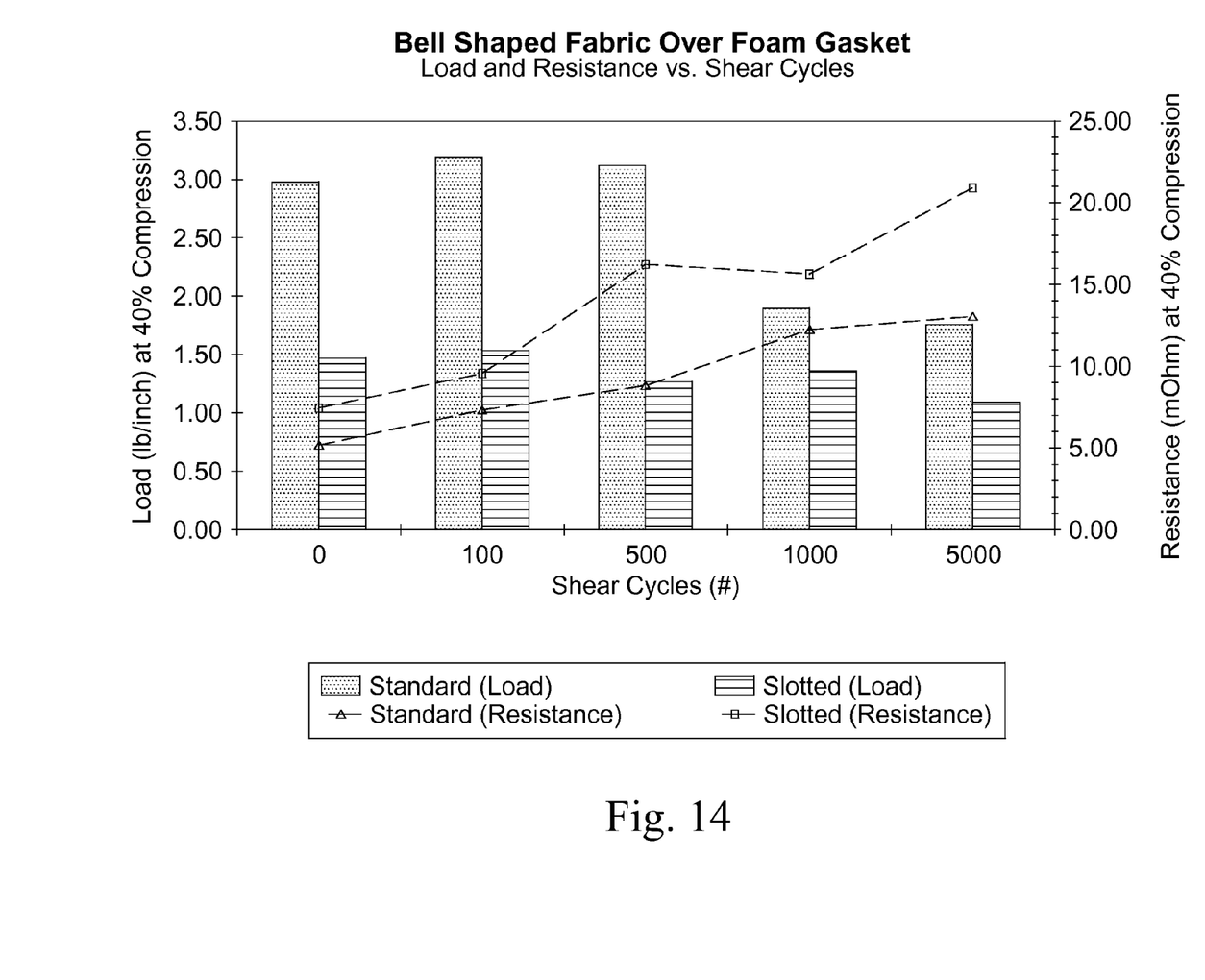
FIG. 14 is a graphical representation of the data shown in FIG. 13.

Exemplary testing was performed to determine whether a fabric-over-foam gasket with transverse slits across the upper surface portion of the gasket provides lower compression force and better cycle life performance than a fabric-over-foam gasket having the same configuration but without any such slits. To this end, fabric-over-foam gasket samples having generally bell-shaped profiles were prepared. Each gasket sample had an approximately 0.1365 inch height and approximately 0.4850 inch width. One notable difference between the test specimens, however, was that one gasket sample had transverse slits about every 0.20 inches along the length of the gasket, where each slit had a width of about 0.290 inches and a penetration depth into the gasket of about 0.80 inches. The other gasket sample, however, did not include any such slits. The testing and results described herein and shown in FIGS. 13 and 14 are provided for purpose of illustration only and not for purposes of limitations, as other embodiments may include gaskets configured to perform differently than what is described herein and shown in FIGS. 13 and 14.

For this exemplary series of testing, cycle testing of the fabric-over-foam gasket samples in shear was performed in a fake door cycle tester. Three twelve-inch long samples of each of the slitted and unslitted gaskets were run for 100, 500, 1000, and 5000 cycles. The test samples were compressed forty percent during the shearing action. The samples were then examined visually and the resistance was measured (at each of the break points in the cycling test) on the horizontal compression tester fitted with resistance probes. The force needed to compress the gasket samples to forty percent compression of the gasket's free-standing uncompressed height was recorded at the same time. The exemplary cycle testing data pertaining to resistance (in Milliohms) and load (in pound-force) obtained from the above-described testing is set forth in Table 1 shown in FIG. 13 and graphically illustrated in FIG. 14.

From this exemplary testing, it was observed that the addition of the transverse slits to a fabric-over-foam gasket increased the resistivity while notably lowering the force necessary for forty percent compression. After 5000 cycles, both the unslitted and slitted fabric-over-foam gasket samples experienced an increase in resistance of less than an order of magnitude, staying below 0.10 Ohms. The load data generally shows that about twice as much compression force was necessary to compress an unslitted gasket to forty percent compression as compared to the compression forced needed for forty percent compression of a gasket with transverse slits. With repeated cycling, the compression force needed for forty percent compression for the slitted and unslitted fabric-over-foam gasket samples began to converge, as shown by the right hand portion of FIG. 14.

Embodiments (e.g., 100, etc.) disclosed herein may be used with a wide range of electronic devices and components. By way of example only, exemplary applications include cellular phones, personal communications devices, printed circuit boards, high frequency microprocessors, central processing units, graphics processing units, laptop computers, notebook computers, desktop personal computers, computer servers, etc. Accordingly, aspects of the present disclosure should not be limited to use with any one specific type of electronic device.

Numerical dimensions and the specific materials disclosed herein are provided for illustrative purposes only. The particular dimensions and specific materials disclosed herein are not intended to limit the scope of the present disclosure, as other embodiments may be sized differently, shaped differently, and/or be formed from different materials and/or processes depending, for example, on the particular application and intended end use.

Certain terminology is used herein for purposes of reference only, and thus is not intended to be limiting. For example, terms such as "upper", "lower", "above", "below", "upward", "downward", "forward", and "rearward" refer to directions in the drawings to which reference is made. Terms such as "front", "back", "rear", "bottom" and "side", describe the orientation of portions of the component within a consistent, but arbitrary, frame of reference which is made clear by reference to the text and the associated drawings describing the component under discussion. Such terminology may include the words specifically mentioned above, derivatives thereof, and words of similar import. Similarly, the terms "first", "second" and other such numerical terms referring to structures do not imply a sequence or order unless clearly indicated by the context.

When introducing elements or features and the exemplary embodiments, the articles "a", "an", "the" and "said" are intended to mean that there are one or more of such elements or features. The terms "comprising", "including" and "having" are intended to be inclusive and mean that there may be additional elements or features other than those specifically noted. It is further to be understood that the method steps, processes, and operations described herein are not to be construed as necessarily requiring their performance in the particular order discussed or illustrated, unless specifically identified as an order of performance. It is also to be understood that additional or alternative steps may be employed.

The description of the disclosure is merely exemplary in nature and, thus, variations that do not depart from the gist of the disclosure are intended to be within the scope of the disclosure. Such variations are not to be regarded as a departure from the spirit and scope of the disclosure.

What is claimed is:

1. A fabric-over-foam EMI gasket for interposition between first and second surfaces, the gasket comprising a resiliently compressible foam core, an outer electrically-conductive fabric layer, and at least one slit extending generally transversely across an upper surface portion of a generally longitudinally extending region of the gasket such that a portion of the at least one slit extends across a midpoint along the upper surface portion, wherein the at least one slit penetrates completely through the electrically-conductive outer fabric layer along the upper surface portion, and wherein the at least one slit penetrates only partially into the resiliently compressible foam core.

2. The gasket of claim 1, wherein the at least one slit linearly extends transversely across the upper surface portion.

3. The gasket of claim 1, further comprising at least two contact elements along opposite sides of the at least one slit, and wherein the at least one slit is configured to allow the at least two contact elements to flex relatively independently from one another.

4. The gasket of claim 1, wherein:
the gasket has a generally bell-shaped profile having a centerline; and
a portion of the at least one slit crosses the centerline.

5. The gasket of claim 1, wherein the at least one slit includes an array of slits extending generally transversely across the upper surface portion.

6. The gasket of claim 5, further comprising a plurality of contact elements each defined generally between corresponding pairs of adjacent slits such that each contact element is flexible relatively independently from the other contact elements.

7. The gasket of claim 1, wherein the at least one slit penetrates substantially completely through the gasket, and wherein the at least one slit has at least one closed end portion such that a solid margin is along at least one side edge portion of the gasket that connects sections of the gasket disposed along opposite sides of the at least one slit.

8. The gasket of claim 1, wherein the at least one slit penetrates substantially the entire thicknesses of the outer electrically-conductive fabric layer and resiliently compressible foam core, and wherein the at least one slit has first and second closed end portions respectively adjacent first and second side edge portions of the gasket such that the first and second closed end portions are respectively closer to the first and second edge portions and the first and second side edge portions include solid margins connecting sections of the gasket disposed along opposite sides of the at least one slit.

9. The gasket of claim 1, further comprising first and second side edge portions extending generally longitudinally along a length of the gasket, and wherein the at least one slit includes a first closed end portion adjacent the first side edge portion, a second closed end portion adjacent the second side edge portion, and a medial portion linearly extending between the first and second closed end portions across the midpoint along the upper surface portion.

10. The gasket of claim 1, wherein the resiliently compressible foam core comprises polyurethane foam, and wherein the fabric comprises nylon rip stock fabric coated with nickel and/or copper.

11. The gasket of claim 1, wherein the at least one slit has a generally rectangular shape when viewed from above.

12. The gasket of claim 1, wherein the at least one slit is configured for helping reduce strain along a longitudinal axis of the gasket when the gasket is compressively sandwiched under pressure into a deflected, collapsed orientation between the first and second surfaces.

13. An electronic device including the gasket of claim 1.

14. The gasket of claim 1, wherein the at least one slit is configured to provide the gasket with sufficient flexibility to be reeled onto a reel.

15. A reel including the gasket of claim 14 reeled thereon.

16. The gasket of claim 1, wherein:
the gasket includes a profile having a centerline; and
the at least one slit includes a portion that extends across the centerline.

17. The gasket of claim 1, wherein:
the gasket includes a profile symmetrical about a centerline that passes through the midpoint along the upper surface portion; and
the at least one slit extends across the midpoint of the upper surface portion towards first and second side edge portions of the gasket such that the at least one slit extends relative to the gasket's profile on both sides of the centerline.

18. The gasket of claim 1, wherein:
the gasket includes first and second side edge portions extending generally longitudinally along a length of the gasket and defining a width in the transverse direction from the first edge portion to the second edge portion; and
the at least one slit extends transversely across the upper surface portion about ninety percent of the width of the gasket.

19. A fabric-over-foam EMI gasket for interposition between first and second surfaces, the gasket comprising a resiliently compressible foam core, an outer electrically-conductive fabric layer, an array of slits generally linearly extending transversely across an upper surface portion of a generally longitudinally extending region of the gasket, and a plurality of contact elements defined generally between corresponding pairs of adjacent slits, the array of slits including one or more portions extending between corresponding first and second side edge portions of the gasket and a midpoint along the upper surface portion, wherein the slits penetrate completely through the electrically-conductive outer fabric layer along the upper surface portion, and wherein the slits penetrate only partially into the resiliently compressible foam core.

20. The gasket of claim 19, wherein the gasket is configured such that each contact element is flexible relatively independently from the other contact elements, whereby the relatively independent movement of the contact elements helps reduce strain along a longitudinal axis of the gasket when the gasket is compressively sandwiched under pressure into a deflected, collapsed orientation between the first and second surfaces.

21. The gasket of claim 19, wherein the slits are equally spaced apart along the upper surface portion, and wherein each slit is substantially identical to the other slits.

22. The gasket of claim 19, wherein the slits penetrate substantially completely through the gasket, and wherein each slit has at least one closed end portion such that a solid margin is along at least one side edge portion of the gasket that connects corresponding sections of the gasket disposed along opposite sides of the slits, wherein at least one slit of the array of slits includes a portion that extends across the midpoint along the upper surface portion.

23. The gasket of claim 19, wherein:
the gasket includes a profile having a centerline; and
the array of slits extend across the centerline.

24. A method of making a fabric-over-foam EMI gasket for interposition between first and second surfaces, the gasket including a resiliently compressible foam core and an outer electrically-conductive fabric layer, the method comprising forming at least one slit that extends generally transversely across an upper surface portion of a generally longitudinally extending region of the gasket such that a portion of the at least one slit coincides with a midpoint along the upper surface portion, wherein forming the at least one slit includes cutting the at least one slit into the gasket without removing material from the gasket, such that the at least one slit penetrates completely through the electrically-conductive outer fabric layer along the upper surface portion and penetrates only partially into the resiliently compressible foam core to a depth sufficient to allow sections of the gasket disposed along opposite sides of the at least one slit to at least partially flex relatively independently from each other.

25. The method of claim 24, wherein forming the at least one slit includes using a rotary die cutter, wherein the at least one slit includes a portion that extends across the midpoint along the upper surface portion.

* * * * *